United States Patent [19]

Briel, Jr. et al.

[11] 4,077,693

[45] Mar. 7, 1978

[54] PANEL-MOUNTABLE CONNECTOR BLOCK ASSEMBLY

[75] Inventors: Henry Christian Briel, Jr., Rochelle Park; Julius Alan Sabo, Colonia, both of N.J.

[73] Assignee: Western Electric Co., Inc., New York, N.Y.

[21] Appl. No.: 748,801

[22] Filed: Dec. 8, 1976

[51] Int. Cl.[2] .......................... H05K 1/06; H05K 1/10

[52] U.S. Cl. ............................... 339/126 R; 248/27.3; 339/128

[58] Field of Search .............. 339/17 C, 17 L, 17 LC, 339/75 MP, 91 R, 125, 126, 128 R, 132 R, 134; 248/27.1, 27.3; 29/735 B, 735 SB, 735 PP

[56] References Cited

U.S. PATENT DOCUMENTS

| | | | |
|---|---|---|---|
| 2,956,215 | 10/1960 | Andrea et al. | 339/17 C X |
| 3,278,145 | 10/1966 | Leshuk | 248/27.3 |
| 3,579,170 | 5/1971 | Baumanis et al. | 339/91 R X |
| 3,812,450 | 5/1974 | Simovits et al. | 339/128 |

*Primary Examiner*—Roy Lake
*Assistant Examiner*—E. F. Desmond
*Attorney, Agent, or Firm*—W. O. Schellin

[57] ABSTRACT

A printed circuit board connector block is inserted partly through a cutout in a panel, and then locked to the panel in its inserted position. The depth to which the connector block is inserted through the cutout is determined by protrusions extending laterally from the block into interfering relationship with the panel. A sliding movement of the block in a direction parallel to the panel translates lugs which were previously inserted through the cutout into vertically interfering relationship with the panel to lock the connector block to the panels. A key is inserted into a gap between the connector block and the panel to eliminate the possibility of a sliding movement of the connector block in a direction opposite to that of the locking movement. The insertion of the key thereby latches the connector block in its mounted position. Since the key is not subjected to vertical forces which may be transmitted through the block to the panel, the key may be of a flexible, thermoplastic material, while the connector block may be formed of a stronger and less heat sensitive thermosetting material. However, the key may be attached to, or guided by, the connector block to facilitate alignment of the key with the gap prior to its insertion therein.

4 Claims, 7 Drawing Figures

FIG.-3
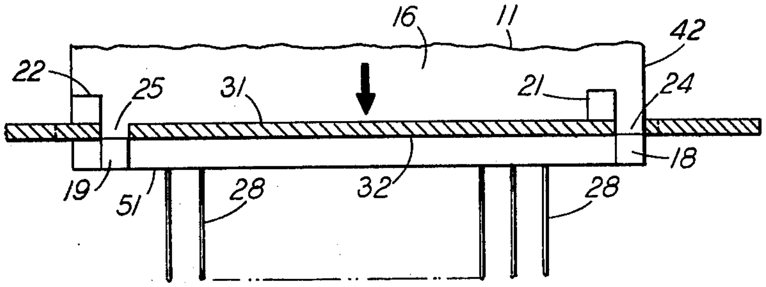
FIG.-4
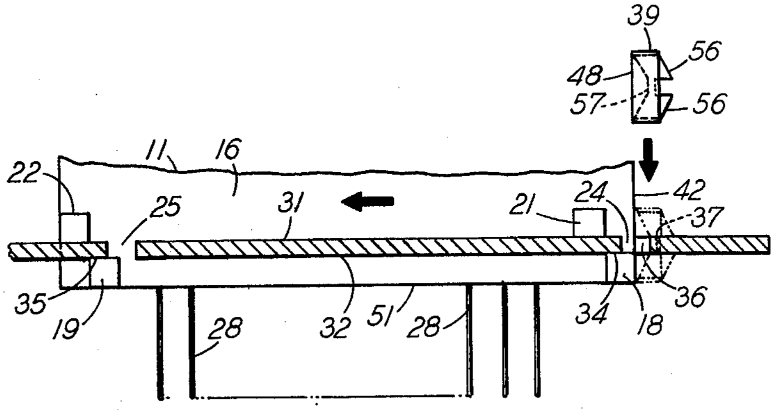
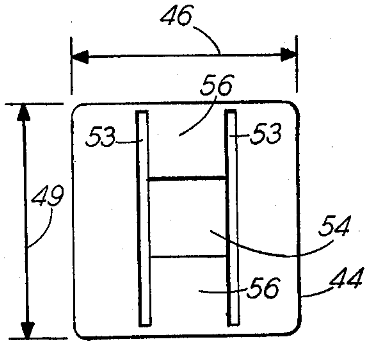
FIG-5
FIG.-6
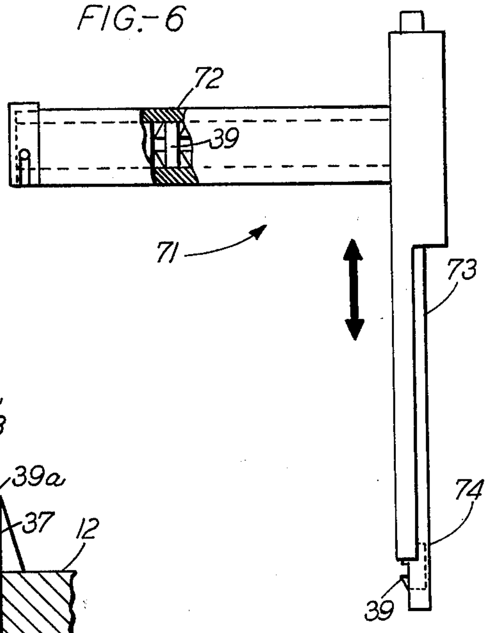
FIG.-7
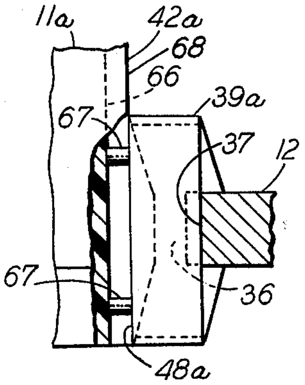

PANEL-MOUNTABLE CONNECTOR BLOCK ASSEMBLY

BACKGROUND OF THE INVENTION

1. Field of the Invention

The present invention relates generally to electrical components which are capable of being inserted into a panel. More particularly, the invention relates to a panel-mountable connector block assembly. For example, such a connector block assembly may house male or female connector contacts which would couple the assembly to mating connector contacts on a cable assembly, or the connector block assembly may be of a type which is used to receive a printed circuit board edge connector. Such connector block assemblies are frequently mounted in relatively large numbers in panels which are part of electrical or electronic apparatus.

2. Description of the Prior Art

A part of the total cost of electronic apparatus is the assembly cost which includes mounting the connector blocks into the panels. The prior art, recognizes the importance of reducing the assembly cost of this type of apparatus by changing from screw-fastened connector blocks to connector blocks which are capable of being mounted by faster and more simple procedures.

For instance, it has been suggested to mount multi-contact printed circuit board connector strips into panels through eyelets at the ends of such strips. Upon insertion of the strips through cutouts into the panels, clips are inserted through the eyelets. The clips, being larger than the width of the cutouts retain the strips in the cutouts of the panels. In such an assembly of a connector strip, two clips, one at each end of the strip, are required to retain the strip. Also, an extraction force acting on the strip in a direction perpendicular to the panel is applied in full force on the clips.

Other connector strips have been inserted through a panel and into interlocked relationship with the panel. The extraction of the connector strips then has been prevented by deforming a portion of the panel into an interfering relationship with the connector strip. Such a manner of mounting the connector strips carries with it the possibility that the panel itself fails. Such a failure, as for instance, a breaking off of a single deformable portion of the panel, might bring about a necessity for replacing the entire panel.

Still other components have been mounted to a panel by inserting lugs through enlarged apertures in the panel and laterally sliding the components to engage protrusions from the components perpendicular to the plane of the panel with an aperture in the panel. Upon such an engagement accidental lateral movement of the components is inhibited. However, such mounting provisions are limited in their application in that a necessary flexure of the panel or of the components to be mounted cannot always be provided.

SUMMARY OF THE INVENTION

It is, therefore, desirable to provide a new and improved panel-mountable connector block assembly.

It is further desirable to provide a connector block assembly which is easily inserted into a panel. Upon insertion, extraction forces on the connector block desirably do not rest on clips, and the retention of the mounted connector block is not predicated on flexure or resiliency in either the panel or the connector block.

In light of these desirable characteristics, a connector block assembly according to the invention includes a connector block capable of being inserted through a cutout in a panel. Protrusions extending from the block into interfering relationship with the panel limit the insertion of the block through the cutout to a predetermined depth. Lugs, which also extend from the block conform in position with notches in the panel along the periphery of the cutout. These notches permit the lugs to be inserted through the cutout in the panel. The inserted portions of the block have a length parallel to the panel which is shorter than the length of the cutout in the panel, permitting a movement of the block after insertion parallel to the panel and in the direction of the length of the cutout. Upon such movement the lugs become located in a position where the panel interferes with the vertical movement of the block. A key inserted into a gap between the block and the panel prevents a lateral movement of the block which would free it from such position interfering with the vertical movement of the block.

A preferred embodiment of the invention also provides for a polarized insertion of the connector block, whereby a predetermined end of the block faces in a certain direction with respect to the panel. A preferred key is biaxially symmetric, thereby simplifying handling problems. The key, being molded or formed separate from the connector block is preferably made of a thermoplastic material. The connector block, however, may nevertheless be made of a more heat-stable thermosetting material.

BRIEF DESCRIPTION OF THE DRAWING

These and other advantages of the invention will become apparent from the detailed description below, which is best understood when read in conjunction with the accompanying drawing wherein:

FIG. 3 and FIG. 4 are side views of the connector block of FIG. 2 in relationship to the panel during successive steps employed in mounting the block of the panel;

FIG. 5 is a front view of a key used to prevent the connector block moving laterally once it is located in an interlocked position with the panel as shown in the side view of FIG. 4;

FIG. 6 is an illustration of an apparatus useful in the insertion of the key of FIG. 5 into the panel; and FIG. 7 illustrates an alternate embodiment of the connector block assembly wherein the key is slidably attached to the block prior to the insertion of the block into the panel.

DETAILED DESCRIPTION

Figure 1:
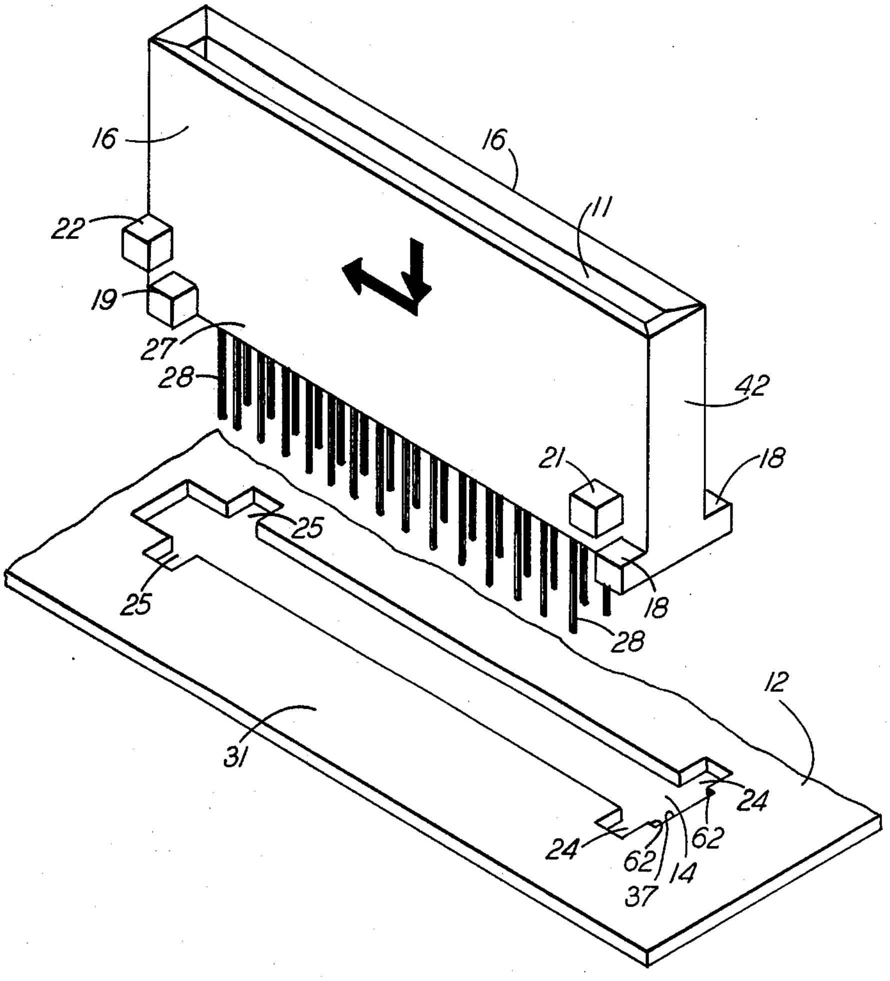
FIG. 1 is a pictorial representation of a panel-mountable printed circuit board connector block positioned in relation to a cutout in a panel.

In FIG. 1, a connector block 11 is located above a panel 12 and in vertical alignment with a cutout 14 into which the block is to be inserted. The panel 12 is typically of a substantially rigid construction. Frequently, it is desirable to insert and mount a plurality of the connector blocks in dense arrays through a plurality of cutouts 14 located in such panels 12.

On the side surfaces 16 of the connector block 11 only one of which is exposed to view in FIG. 1, provisions for mounting the block include lower lugs 18 and 19 and upper lateral protrusions or lugs 21 and 22. The lugs are preferably located symmetrically opposite from each other about a vertical plane of symmetry through the connector block 11. The lower lugs are also located in registration with peripheral recesses or square notches 24 and 25 of the modified rectangular cutout 14 in the panel 12. When aligned with the notches 24 and 25 the lower lugs 18 and 19 are capable of being inserted through the cutout 14 as a lower end 27 of the connector block 11 including pins 28 are inserted into the panel 12.

FIG. 3 shows in a side view how the connector block 11 is inserted into the cutout 14. The lower end 27 of the block 11 including the lower lugs 18 and 19 pass through the panel 12. However, the upper lugs 21 and 22 are not aligned with the notches 24 and 25 and therefore come to rest on a top surface 31 of the panel 12. As seen, for instance, in FIG. 1, the upper lugs 21 and 22 are vertically spaced from the lower lugs 18 and 19 by a distance sufficient to accept the thickness of the panel therebetween. Consequently, as the upper lugs 21 and 22 come to rest on the surface 31 to limit further insertion of the connector block 11 through the cutout 14, the lower lugs 18 and 19 have passed completely through and have become located just below a lower surface 32 of the panel 12.

The length of the cutout 14 in the panel 12 is sufficiently greater at one end than the length of the connector block 11. The greater length of the cutout 14, or conversely the shorter length of the inserted portion of the connector block 11 with respect to the length of the cutout 14, permits a movement of the connector block 11 in a direction of the length of the cutout 14.

In FIG. 3 the connector block 11 is shown in a fully inserted position, the direction of insertion being indicated by the vertical arrow pointing downward. Once inserted, as shown in FIG. 3, the connector block 11 is moved in the direction of the length of the cutout 14 into an interlocked position with the panel. FIG. 4 shows the connector block 11 after such a movement in the direction of the arrow parallel to the plane of the panel 12. The lower lugs 18 and 19 have moved from a vertically conforming or aligned position with the notches 24 and 25, respectively, into the interlocked or latched position wherein edges 34 and 35 of the panel 12 interfere with a vertical extraction of the connector block 11 from the panel.

The movement of the connector block 11 parallel to the plane of the panel 12 generates an increased space or gap 36 between the connector block 11 and an end 37 of the cutout 14. A key 39 shown in FIG. 4 prevents, when inserted into the gap 36, an accidental movement of the connector block 11 from the latched position as shown in FIG. 4. A front view of the key 39 is shown in FIG. 5. The key 39 is preferably molded of a thermoplastic material such as polyamide. The thickness of the key 39 is selected such that it substantially fills the gap 36. Once inserted into the gap 36 it also becomes locked in that position to retain the connector block 11 in its interlocked position. In the inserted position, the key 39 rests flatly against an end face 42 of the connector block 11 and becomes locked against the panel at the end 37 of the cutout 14.

The key 39 has a rectangular base 44. The base 44 has a width 46 which is preferably the same as the width of the end face 42 of the connector block 11. A base surface 48 of the key comes to rest against the end face 42 of the connector upon insertion of the key 39 into the gap 36. The key 39 is centered on the panel 12 when the key is fully inserted and a length 49 is preferably chosen to place the lowermost portion of the key 39 approximately even with a lower edge 51 of the connector block 39.

Referring to FIGS. 4 and 5, two longitudinal slots 53 define in the center of the base 44 a crowned camming section 54. Two oppositely facing but otherwise identical cam elements 56 rise from each end of the section 54 above the thickness of the key 39. These elements 56 are connected by a thin bridging link 57 which lies confined in a space within the thickness of the key 39. When the key 39 is inserted into the gap 36, the lower one of the elements 56 resiliently yields and is cammed by the end 37 into the space occupied by the thickness of the key 39. As the lower one of the elements 56 becomes positioned fully below the lower surface 32 of the panel 12, the element 56 returns to its original extended position and moves thereby into an interfering engagement with the panel 12 at the end 37 of the cutout. The upper cam element remains in a normally projecting position to prevent further insertion of the key 37 by the interference of an inner stop surface 61 of the cam element.

While being inserted into the gap 36, the key is laterally guided within a short extension of the length of the cutout 14 beyond the end of the notches 18. Short ledges 62 (shown in FIG. 1) provide such lateral guidance which minimizes a tendency of the key to twist within the gap 36 during its insertion.

Figure 2:
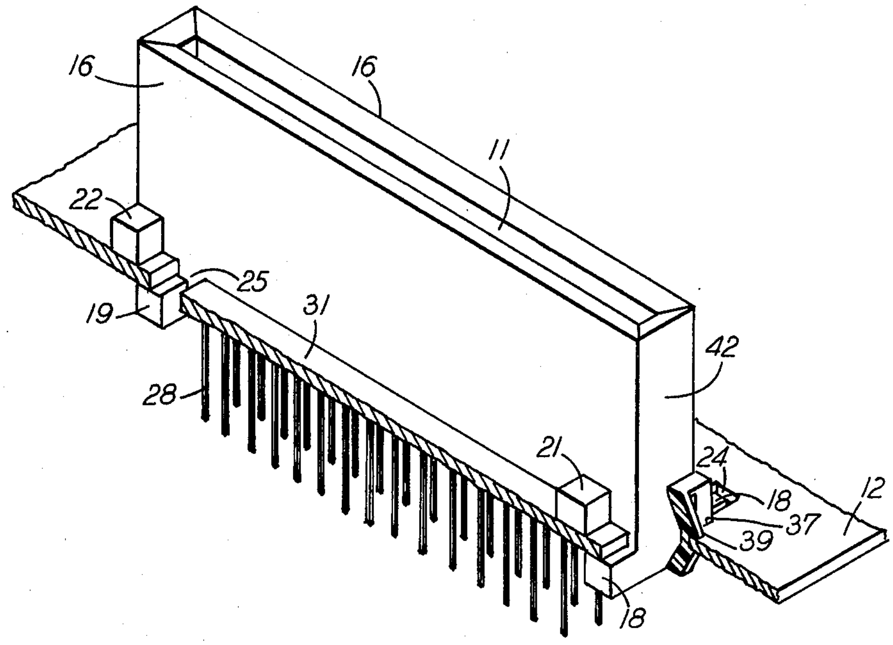
FIG. 2 is a partial section showing the connector block as an assembly mounted in the panel.

FIG. 2 illustrates an advantage of the connector block assembly which is derived from a manner in which the connector block 11 becomes interlocked with the panel 12 and the key 39 lodges in the gap 36 to restrict further lateral movement of the connector block 11. While the key 39 retains the connector block 11 in this interlocked position, it nevertheless remains substantially isolated from stresses due to vertical forces exerted on the connector block 11. Such forces are transmitted through the lugs 18 and 19 directly to the panel 12 when, for instance, a circuit board is inserted into or extracted from the connector block 11. Since the key 39 is isolated from such stresses it can be formed of a resilient and economical thermoplastic material.

Furthermore, because of the resiliency of the camming section 54, neither the connector block 11 per se nor the panel 12 needs to exhibit additional resilient qualities for the connector block assembly to become removably mounted in the panel 12. If it becomes desirable to remove the connector block 11 from the panel 12, the key 39 is quickly dislodged and removed from the gap 36 by depressing one of the cam elements 56 with an appropriately pointed tool (not shown), and then pushing the key 39 out of the gap 36. Thereafter, the connector block 11 is moved laterally within the cutout 14 to align the lower lugs 18 and 19 with the respective notches 24 and 25. From this aligned position, shown in FIG. 3, the connector block 11 is simply extracted from the panel 12.

Even though the key 39 has been referred to as being part of the connector block assembly, there are advantages in it being a distinctly separate element. For instance, the key 39 is preferred to be of a thermoplastic material, while the connector block 11 is preferred to be molded of a thermosetting material. The use of a stronger, thermosetting material for the connector block 11 is advantageous, for example, in the assembly of wires to the pins 28 by solder processes. Normal solder temperatures exceed allowable maximum temperatures for most molded thermoplastic materials.

Another reason for handling the key 39 as a separate element prior to assembling block 11 in the cutout 14 is that such separate handling offers the possibility of automated key insertion by automatic or semi-automatic handling apparatus 71, such as that shown in FIG. 6. For instance, it may be advantageous to dispense the key 39 from a plurality of such keys stored in a magazine 72 of the apparatus 71. The keys 39 are then guided, for example, along a reciprocating track 73. The track 73 terminates in an insertion tip 74. The stroke length of the track is advantageously chosen to dispense and feed another key 39 from the magazine 72 into the track 73 for each one of the previously inserted keys 39. The apparatus 71 shown in FIG. 6 may be part of a fixed fully automatic insertion apparatus (not shown) or it may be incorporated into a more compact hand-held insertion tool. The feed stroke of the track 73 in such a tool is advantageously activated by a downwardly directed insertion force against a pistol grip handle which conveniently houses the magazine 73.

The economics of the described automated insertion of the key 39 into the gap 36 are furthered by the fact that only one key is required to retain the connector block in its interlocked position within the panel 12. Another advantage of the key 39 is the manner in which it is inserted to retain the connector block 11 in the panel. Since the direction of insertion of the connector block is perpendicular to the panel 12, space requirements to insert the key 39 adjacent the connector block 11 are limited essentially to the space occupied by the track 73. Consequently, a plurality of the connector blocks 11 can be mounted in a close array on the panel 12.

In the event that an automated insertion of the key 39 is not preferred, an alternate embodiment of the connector block assembly, a portion of which is shown in FIG. 7, may be used. In FIG. 7, keyways or grooves 66 are provided in an end face **42*a* of an alternate connector block 11*a*. Corresponding interlocking extensions or pins 67 at a base surface 48*a* are inserted into the grooves 66 to locate a key 39*a* adjacent the end face 42*a* of the connector block 11*a*. The grooves 66 in the end face 42*a* extend in length toward an upper part of the connector block 11*a*. Initially the key 39*a* is assembled to and remains in the upper part 68 of the connector block 11*a*. After the connector block 11*a* has been inserted in a respective cutout 14 and moved into an interlocking position with the panel 12 by the already described lateral movement, the key 39*a* is slidingly pushed toward the panel 12 and into the gap 36, guided by the pins 67 which slide within the grooves 66. This latter embodiment has the advantage that the key 39*a* becomes part of the connector block 11*a*, prior to its assembly into the panel 12, since the key 39*a* may be attached to the connector block 11*a* as one of its manufacturing steps. The combination of the connector block and the key may then be handled or stored for future use as a single assembly prior to its insertion into the panel 12. Such a preassembly of the connector block 11*a* and the key 39*a*** is advantageous for replacement connectors which may be used for repairs of already existing electrical apparatus.

A particular advantage of the connector block assembly is its polarized orientation with respect to the panel. For instance, in referring to FIGS. 1 and 2, it is noted that the lower lugs 18 are located closer to their respective end of the connector block 11 than the lower lugs 19 are located to their end of the connector block. When the connector block 11 is to be inserted into the cutout 15 of the panel 12, it becomes necessary to ascertain whether the connector block 11 is oriented to align the lugs 18 and 19 with the notches 24 and 25, respectively.

A polarized orientation of the connector block 11 is particularly useful when the connector block 11 houses dedicated contacts which are not symmetrically located within the block. Of course, it should be understood that lugs 18 and 19 on the connector block 11 can be formed in symmetrical positions with respect to the connector block 11, especially when contacts housed along the length of the connector are also arranged in a symmetrical pattern.

It should also be noted, that the upper lugs 21 and 22 need not be in the form of localized protrusions from the lateral surface 16 of the connector block 11. The shape and size of the lugs 21 and 22 is however frequently limited by how much complexity in a molding die can be tolerated. However, it should be understood that in a broad sense the lugs 21 and 22 represent a ledge on which the connector block 11 comes to rest after it has been inserted through the cutout 14. In the depicted preferred embodiment, the lugs 21 and 22, laterally offset from the lower lugs 18 and 19, were found to be easily incorporated into a molding die.

The above description of specific embodiments of the invention has been given for purposes of illustration and not for limitation. Within the scope and spirit of the invention as set forth by the appended claims certain changes and structural modification are possible.

What is claimed is:

1. A connector block assembly comprising:

a connector block capable of being inserted through a cutout in a panel having an upper and a lower surface to locate portions of the block on both surfaces of the panel;

protrusions extending from the block into interfering relationship with the panel to limit insertion of the block through the cutout to a predetermined depth;

lugs extending from the block, the lugs being spaced in conforming relationship with notches in the panel along the periphery of the cutout to permit the lugs to be inserted through the panel, the inserted portion of the block having a length in the plane of the panel which is less than that of the cutout to permit a movement of the block in the direction of the length of the cutout upon the block being inserted therethrough, the lugs upon such movement being located in interfering relationship with the panel to prevent extraction of the block from the panel; and a key capable of being inserted into a space in the plane of the panel between an end of the cutout and an end of the block to prevent a return movement of the block and a movement of the lugs into conforming position with the notches, the key including a base having a predetermined thickness to fill the space between the end of the cutout and the end of the block, and a resiliently deformable center section including two cam members slopingly extending from opposite edges of the base in an increasing height about and toward the center of the base, the two cam members terminating in detenting surfaces facing each other and being spaced from each other by an amount equal to the thickness of the panel, the cam members being interconnected by a bridging link located within the space defined by the thickness of the base, the link being flexible to permit at least one of the cam members to be resiliently depressed into the space defined by the thickness of the base.

2. A connector block assembly according to claim 1 wherein:

a first pair of the lugs extending from the block is located at a first distance from one end of the length of the block and a second pair of the lugs is located at a second distance less than the first distance from the other end of the length of the block, and the notches are similarly offset with respect to the length of the cutout to require the block to be oriented in a polarized direction in which both the position of the lugs conforms with that of the notches in the panel and the length of the cutout accepts the length of the block.

3. A connector block assembly according to claim 1, wherein:

the connector block comprises at least one molded component the composition of which is a thermosetting glass-filled phenolic material; and the key is formed of a thermoplastic material.

4. A connector block assembly according to claim 3, wherein the key is held in contact with the block by the confines of the cutout in the panel after the block and the key have been inserted into the cutout of the panel.

* * * * *